(12) United States Patent
Chang et al.

(10) Patent No.: US 9,530,503 B2
(45) Date of Patent: Dec. 27, 2016

(54) AND-TYPE SGVC ARCHITECTURE FOR 3D NAND FLASH

(71) Applicant: MACRONIX INTERNATIONAL CO., LTD., Hsinchu (TW)

(72) Inventors: Kuo-Pin Chang, Hsinchu (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/723,321

(22) Filed: May 27, 2015

(65) Prior Publication Data
US 2016/0247570 A1    Aug. 25, 2016

Related U.S. Application Data

(60) Provisional application No. 62/117,958, filed on Feb. 19, 2015.

(51) Int. Cl.
*G11C 16/04* (2006.01)
*G11C 16/08* (2006.01)

(52) U.S. Cl.
CPC ........... *G11C 16/0483* (2013.01); *G11C 16/08* (2013.01)

(58) Field of Classification Search
CPC ... H01L 27/115; H01L 27/11521; G11C 16/10
USPC .......................... 365/185.17, 185.05, 51, 63
See application file for complete search history.

(56) References Cited

U.S. PATENT DOCUMENTS

| | | | |
|---|---|---|---|
| 6,906,940 B1 | 6/2005 | Lue | |
| 7,177,169 B2 | 2/2007 | Scheuerlein | |
| 7,180,785 B2 | 2/2007 | Kurihara | |
| 7,315,474 B2 | 1/2008 | Lue | |
| 7,420,242 B2 | 9/2008 | Lung | |
| 7,696,559 B2 | 4/2010 | Arai et al. | |

(Continued)

FOREIGN PATENT DOCUMENTS

EP    2048709 A2    4/2009

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.

(Continued)

*Primary Examiner* — Son Dinh
(74) *Attorney, Agent, or Firm* — Yiding Wu; Haynes Beffel & Wolfeld LLP

(57) ABSTRACT

A memory device includes a plurality of strings of memory cells. A plurality of stacks of conductive strips includes first upper strips configured as first string select lines for the strings in the plurality of strings, second upper strips configured as second string select lines for the strings in the plurality of strings, and intermediate strips configured as word lines for the strings in the plurality of strings. The memory device includes control circuitry coupled to the first string select lines and the second string select lines, and configured to select a particular string in the plurality of strings by applying a first turn-on voltage to a first string select line in the first string select lines coupled to the particular string, and a second turn-on voltage to a second string select line in the second string select lines coupled to the particular string.

20 Claims, 9 Drawing Sheets

(56) References Cited

U.S. PATENT DOCUMENTS

| | | | |
|---|---|---|---|
| 7,700,997 | B2 | 4/2010 | Futatsuyama et al. |
| 7,851,849 | B2 | 12/2010 | Kiyotoshi |
| 8,363,476 | B2 | 1/2013 | Lue et al. |
| 8,363,505 | B2 | 1/2013 | Chang et al. |
| 8,467,219 | B2 | 6/2013 | Lue |
| 8,503,213 | B2 | 8/2013 | Chen et al. |
| 8,654,591 | B2 | 2/2014 | Akaogi |
| 8,759,899 | B1 | 6/2014 | Lue et al. |
| 2005/0280061 | A1 | 12/2005 | Lee |
| 2007/0045708 | A1 | 3/2007 | Lung |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2012/0119283 | A1 | 5/2012 | Lee et al. |
| 2012/0182806 | A1 | 7/2012 | Chen et al. |
| 2013/0100758 | A1 | 4/2013 | Chen et al. |
| 2013/0148445 | A1 | 6/2013 | Chen et al. |
| 2013/0176781 | A1* | 7/2013 | Hung .................. G11C 16/0483 365/185.05 |
| 2014/0226427 | A1 | 8/2014 | Kim et al. |
| 2014/0254284 | A1 | 9/2014 | Hung et al. |
| 2014/0269077 | A1* | 9/2014 | Shih ....................... G11C 16/10 365/185.17 |

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai, Erh-Kun, et al., "A Multi-Layer Stackable Thin-Film Transistor (TFT) NAND-Type Flash Memory," Electron Devices Meeting, IEDM 2006, Int'l Dec. 11-13, 2006, 4 pages.

Lue, H-T. et al., "A Highly Scalable 8-Layer 3D Vertical-Gate (VG) TFT NAND Flash Using Junction-Free Buried Channel BE-SONOS Device," Jun. 15-17, 2010 Symp. on VLSI Technology, Digest of Technical Papers, pp. 131-132.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," Jun. 12-14, 2007 Symp. VLSI Tech., Digest of Tech. Papers, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

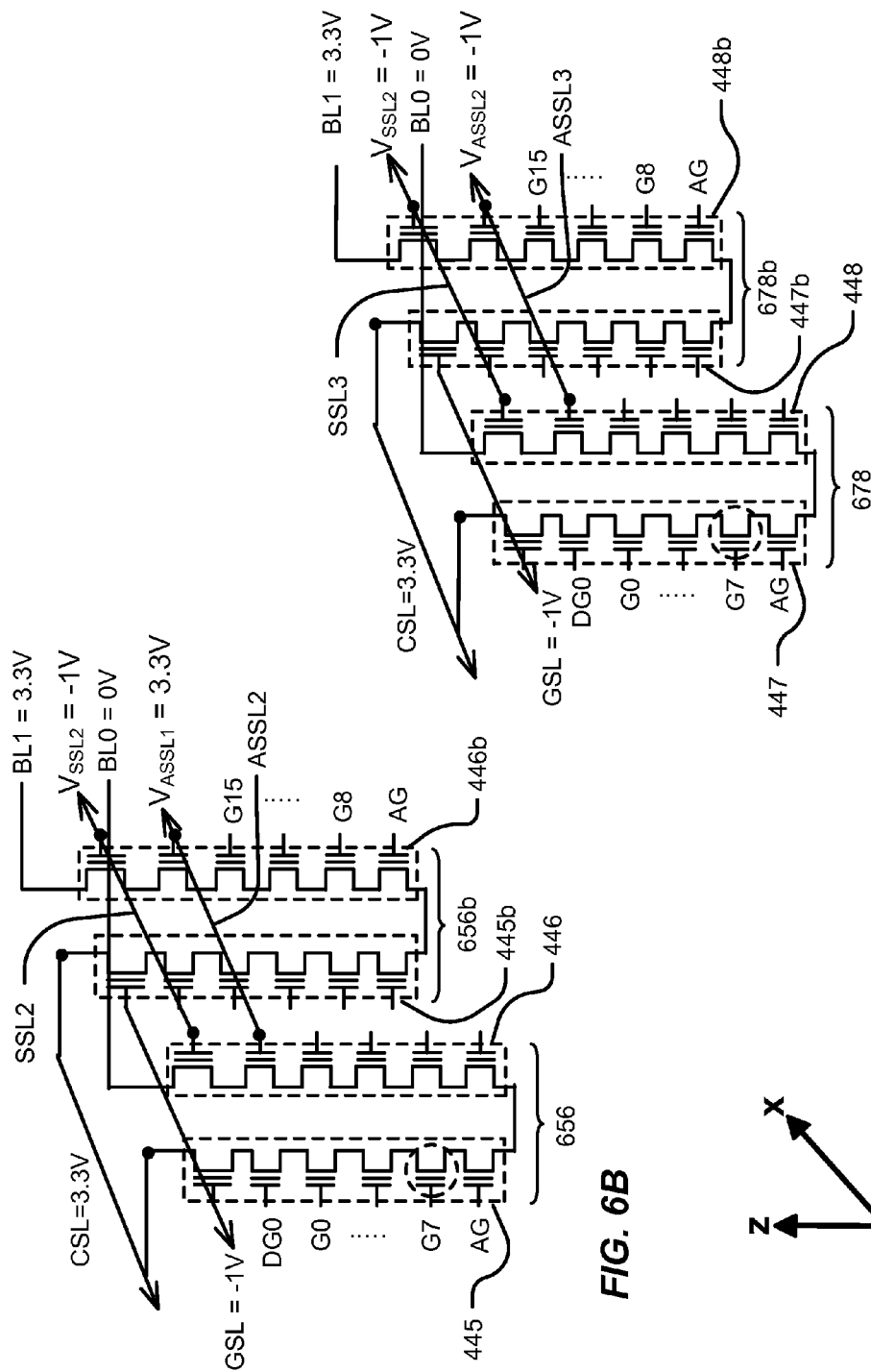

US 9,530,503 B2

AND-TYPE SGVC ARCHITECTURE FOR 3D NAND FLASH

RELATED APPLICATIONS

This application claims the benefit of U.S. Provisional Patent Application No. 62/117,958 filed on 19 Feb. 2015, which application is incorporated by reference as if fully set forth herein.

BACKGROUND

Field of the Technology

The present invention relates to high density memory devices, and particularly to memory devices in which multiple planes of memory cells are arranged to provide a three-dimensional 3D array.

Description of Related Art

High density memory devices are being designed that comprise arrays of flash memory cells, or other types of memory cells. In some examples, the memory cells comprise thin film transistors which can be arranged in 3D architectures.

A 3D memory device can include an array of NAND strings of memory cells. The memory device can include an integrated circuit substrate, and a plurality of stacks of conductive strips separated by insulating material, including at least a bottom plane of conductive strips configured as ground select lines (GSL), a plurality of intermediate planes of conductive strips configured as word lines (WLs), and a top plane of conductive strips configured as string select lines (SSLs). Active strips are disposed on the plurality of stacks, and arranged orthogonally over the plurality of stacks. Memory cells including charge storage structures are formed at cross-points between side surfaces of the active strips on the plurality of stacks and the word lines.

A 3D memory device can include different metal layers for routing word lines, string select lines, ground select lines, bit lines connected to the active strips, etc. For example, a first metal layer over the stacks of conductive strips can include conductor lines for routing local source lines, a second metal layer over the first metal layer can include conductor lines for routing bit lines, and a third metal layer over the second metal layer can include conductor lines for routing word lines, string select lines and ground select lines. String select lines (SSLs) in the top plane of conductive strips are routed to a row decoder in the 3D memory device. The row decoder decodes SSL and GSL lines for read, write and erase operations on memory cells in the 3D memory device. The third metal layer includes respective conductor lines for respective string select lines in the 3D memory device. For instance, for 32 strings select lines in 32 NAND strings, the third metal layer includes 32 conductor lines routed to the 32 string select lines. Routing efficiency regarding string select lines, at a metal level such as the third metal level, is affected by string select structures.

It is desirable to provide efficient string select structures for three-dimensional integrated circuit memory.

SUMMARY

The present technology provides efficient string select structures that improve the routing efficiency, by reducing the number of conductor lines at a metal level for routing the string select lines to the row decoder. In one implementation, for (N times K) string select lines, the number of conductor lines at a metal level for routing the string select lines to the row decoder is reduced from (N×K) to (N+K), where N and K are positive integers. For example, if N=4 and K=8, then the number of conductor lines at a metal level is reduced from (N×K=4×8=32) to (N+K=4+8=12).

A memory device is provided that includes a plurality of strings of conductive strips. A plurality of stacks of conductive strips includes first upper strips configured as first string select lines for the strings in the plurality of strings, second upper strips configured as second string select lines for the strings in the plurality of strings, and intermediate strips configured as word lines for the strings in the plurality of strings. The second upper strips can be disposed between the upper strips and the intermediate strips.

The memory device includes control circuitry coupled to the first string select lines and the second string select lines, and configured to select a particular string in the plurality of strings by applying a first turn-on voltage to a first string select line in the first string select lines coupled to the particular string, and a second turn-on voltage to a second string select line in the second string select lines coupled to the particular string. The second turn-on voltage can be lower than the first turn-on voltage.

The control circuitry is configured to deselect a particular string in the plurality of strings by applying a turn-off voltage to one or both of a first string select line in the first string select lines coupled to the particular string, and a second string select line in the second string select lines coupled to the particular string.

The plurality of strings of memory cells includes multiple sets of strings. The memory device includes first string select structures, where each of the first string select structures is coupled to first string select lines in a respective set of strings in the multiple sets of strings, and second string select structures, where each of the second string select structures is coupled to a respective second string select line in each set of strings in the multiple sets of strings. A combination of a first string select structure in the first string select structures and a second string select structure in the second string select structures selects a string in the multiple sets of strings. Each of the second string select structures is coupled to multiple strings in respective sets of strings in the multiple sets of strings.

The plurality of strings of memory cells can include K sets of N strings. The memory device can include K first string select structures, where each of the K first string select structures is coupled to N first string select lines in a respective set in the K sets of N strings, and N second string select structures, where each of the N second string select structures is coupled to a respective second string select line in each set in the K sets of N strings. A combination of a first string select structure in the K first string select structures and a second string select structure in the N second string select structures selects a string in the K sets of N strings.

The K first string select structures can include K first linking elements in a first patterned conductor layer over the plurality of stacks of conductive strips, where each of the K first linking elements connects N first string select lines in a respective set in the K sets of N strings. The N second string select structures can include N second linking elements in the first patterned conductor layer, where each of the N second linking elements connects a respective second string select line in each set in the K sets of N strings.

The K first string select structures can include first interlayer connectors connecting K first patterned conductor lines to the K first linking elements respectively. The N second string select structures include second interlayer connectors connecting N second patterned conductor lines to the N second linking elements respectively. The K first patterned conductor lines and the N second patterned conductor lines are disposed in a patterned conductor layer or layers higher than the first patterned conductor layer, connecting the K sets of N strings to a string decoder.

In one implementation, the plurality of stacks includes even stacks and odd stacks. The memory device includes data storage structures on sidewalls of corresponding even stacks and odd stacks of conductive strips in the plurality of stacks, and semiconductor films disposed on the data storage structures on the sidewalls of the corresponding even stacks and odd stacks, and connected to form a current path from an upper end to a lower end of the semiconductor films on the corresponding even stacks, and from a lower end to an upper end of the semiconductor films on the corresponding odd stacks.

The even stacks of conductive strips include the first upper strips configured as the first string select lines and the second upper strips configured as the second string select lines. The odd stacks of conductive strips include upper strips configured as ground select lines. At least one of the even stacks and odd stacks of conductive strips include bottom strips configured as assist gates disposed below the intermediate strips.

In an alternative implementation, data storage structures are disposed on sidewalls of stacks of conductive strips in the plurality of stacks. Semiconductor films are disposed on the data storage structures on the sidewalls of the stacks, forming a current path from an upper end to a lower end of the semiconductor films on the stacks. The stacks include bottom strips configured as ground select lines disposed below the intermediate strips.

Other aspects and advantages of the present technology can be seen on review of the drawings, the detailed description and the claims, which follow.

BRIEF DESCRIPTION OF THE DRAWINGS

FIGS. 6A, 6B and 6C illustrate portions of the simplified schematic diagram in FIG. 4 along the X-direction, showing bias voltages on the first string select lines and second string select lines for selecting and deselecting strings of memory cells.

DETAILED DESCRIPTION

Figure 1:
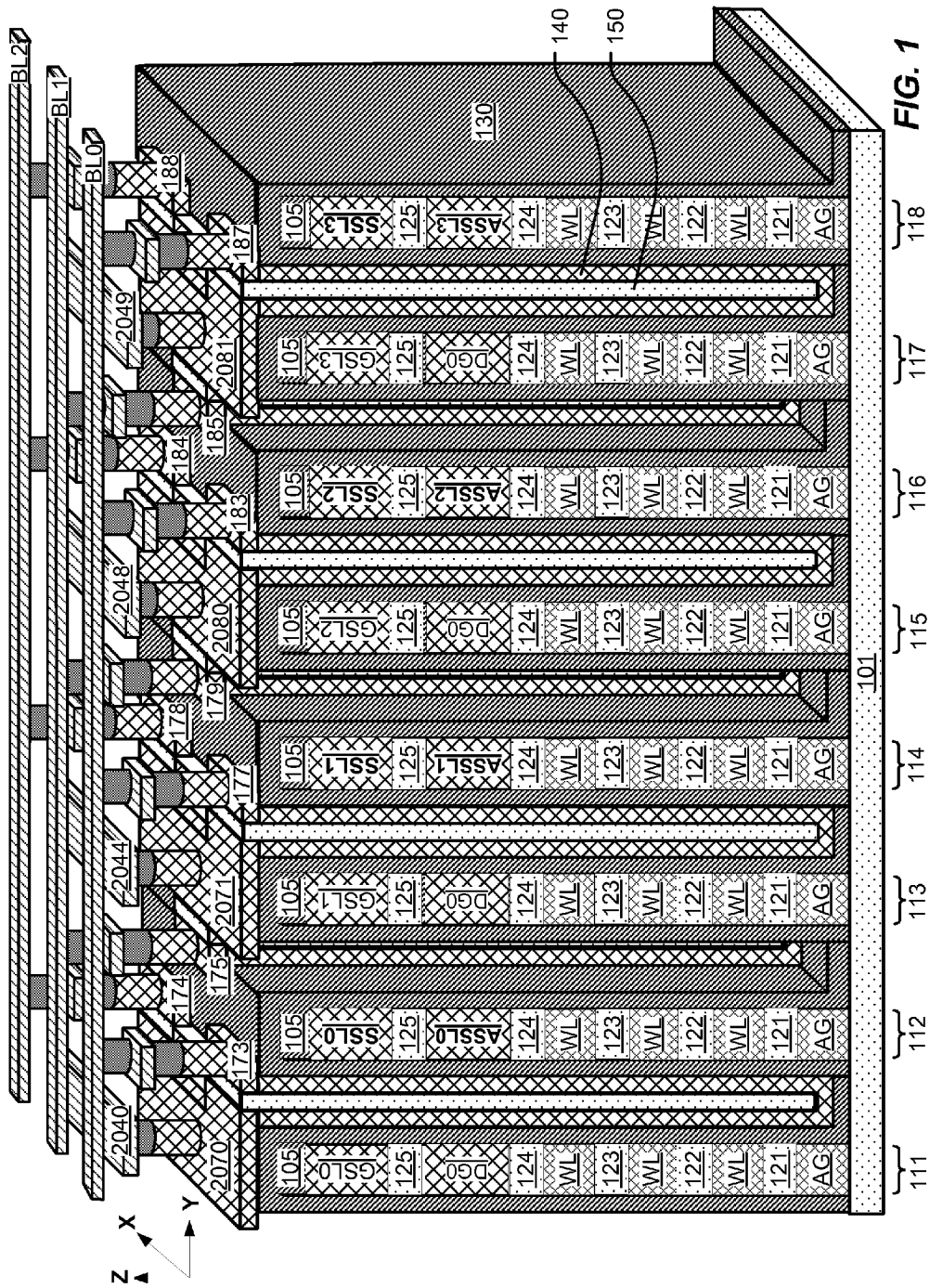
FIG. 1 is a simplified perspective diagram of a 3D NAND memory device as described herein.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified perspective diagram of a 3D NAND memory device as described herein. The memory device includes a plurality of strings of conductive strips. A plurality of stacks of conductive strips includes first upper strips configured as first string select lines for the strings in the plurality of strings, second upper strips configured as second string select lines for the strings in the plurality of strings, and intermediate strips configured as word lines for the strings in the plurality of strings.

The plurality of stacks of conductive strips includes even stacks (e.g. 112, 114, 116 and 118) and odd stacks (e.g. 111, 113, 115 and 117). The even stacks of conductive strips 112, 114, 116 and 118 include first upper strips configured as first string select lines (e.g. SSL0, SSL1, SSL2 and SSL3), second upper strips configured as second string select lines (e.g. ASSL0, ASSL1, ASSL2 and ASSL3), and intermediate strips configured as word lines (e.g. WL), wherein the second upper strips are disposed between the upper strips and the intermediate strips. The first string select lines and the second string select lines are further described in connection with FIGS. 3 and 4.

The odd stacks of conductive strips (e.g. 111, 113, 115 and 117) in the memory device can include upper strips configured as ground select lines (e.g. GSL0, GSL1, GSL2 and GSL3). An odd stack (e.g. 111) can also include a dummy strip (e.g. DG0) between the upper strip (e.g. GSL0) and the intermediate strips (e.g. WLs) in the odd stack, that is not configured to form a memory cell for data storage, but to prevent GIDL (gate induced drain leakage) at the ground select line (e.g. GSL0) in the odd stack. At least one of the even stacks and odd stacks of conductive strips can include bottom strips configured as assist gates (AG) disposed below the intermediate strips.

The stacks of conductive strips can be disposed on an insulating layer 101 which can comprise a silicon oxide or other dielectric on a semiconductor substrate. The stacks 111-118 include layers of insulating material 121, 122, 123, 124 and 125, separating the conductive strips in the stacks from one another. In embodiments described herein, the conductive material can be a heavily p-type doped polysilicon (P+ polysilicon) or other material selected for compatibility with the data storage structure. A layer of silicon nitride 105 which can be used to provide tensile stress, is deposited over a top layer, in this example. This layer can improve the uniformity of the stacks and reduce bending. The layers of insulating material can comprise silicon dioxide deposited in a variety of ways as known in the art. Also, the layers of insulating material can comprise other insulating materials, and combinations of insulating materials. In this example, all of the insulating layers, with the exception of the layer of silicon nitride 105, consist of the same material. In other examples, different materials can be used in different layers as suits a particular design goal.

Data storage structures 130 are disposed on the sidewalls of the corresponding even and odd stacks of conductive strips. Semiconductor films 140 are disposed on the data storage structures 130 on the sidewalls of the corresponding even and odd stacks. An insulating material 150 such as silicon dioxide is filled between stacks on the inside surfaces of the semiconductor films 140. Data storage structures 130, semiconductor films 140, and the insulating material 150 are further described in connection with FIG. 2.

Semiconductor films 140 include portions 2070, 2071, 2080 and 2081 which overlie the odd stacks 111, 113, 115 and 117 respectively. Portions 173, 174 and 175 overlie the even stack 112, portions 177, 178 and 179 overlie the even stack 114, portions 183, 184 and 185 overlie the even stack 116, and portions 187 and 188 overlie the even stack 118. The portions 2070, 2071, 2080 and 2081 connect the semiconductor films having outside surfaces disposed on the data storage structures on the sidewalls of the odd stacks 111, 113, 115 and 117 on the common source side of the NAND strings together and provide landing areas for interlayer connectors for connection to a common source line. The portions 173, 174, 175, 177, 178, 179, 183, 184, 185, 187 and 188 are separated and provide landing areas for interlayer connectors making independent connections to bit lines.

A patterned conductor layer or layers overlie the stacks. A first interlayer connector connects a first conductor (e.g. bit lines BL0, BL1, BL2) to a top surface of a first semiconductor film on the data storage structures on the sidewalls of an even stack in the plurality of stacks (e.g. 112, 114, 116 and 118). A second interlayer connector connects a second conductor (e.g. source reference conductor lines 2040, 2044, 2048 and 2049) to a top surface of a second semiconductor film on the data storage structures on the sidewalls of a corresponding odd stack in the plurality of stacks (e.g. 111, 113, 115 and 117).

Figure 2:
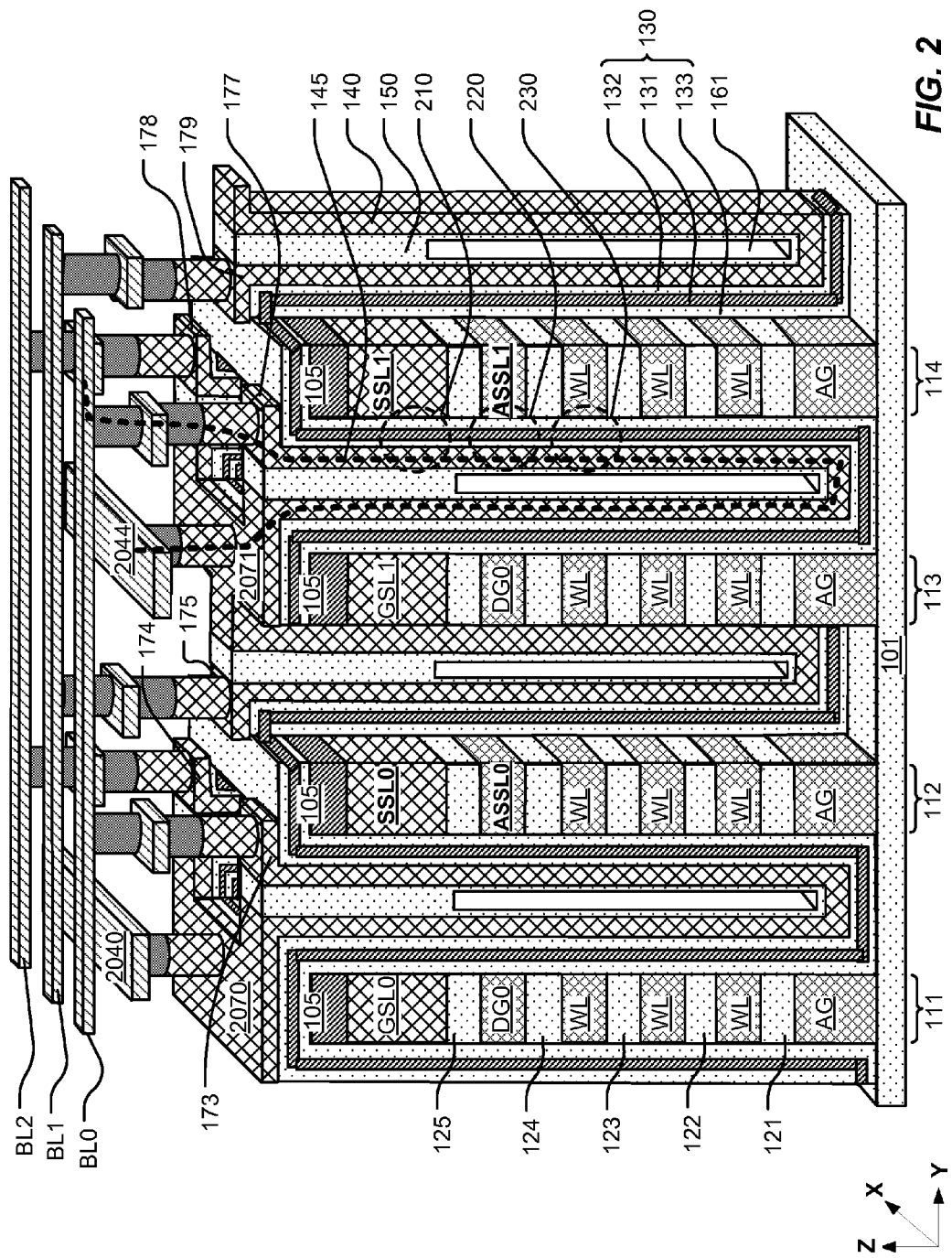
FIG. 2 illustrates stacks of conductive strips shown in FIG. 1 in more details.

FIG. 2 illustrates stacks of conductive strips shown in FIG. 1 in more details. Description about FIG. 1 is generally applicable to FIG. 2. Like elements in FIG. 2 are referred to with like reference numerals as in FIG. 1.

Data storage structures 130 can include a tunneling layer 132, a charge storage layer 131, and a blocking layer 133. The data storage structures 130 can include for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

Semiconductor films 140 have outside surfaces and inside surfaces. The outside surfaces are disposed on the data storage structures on the sidewalls of the corresponding even and odd stacks in the plurality of stacks forming a 3D array of memory cells (e.g. 230). The semiconductor films 140 are connected to form a current path 145 from an upper end to a lower end of the semiconductor film on the corresponding even stacks, and from a lower end to an upper end of the semiconductor film on the corresponding odd stacks. Insulating material 150 can leave an air gap 161 at least in regions adjacent the intermediate strips of conductive strips (e.g. WL).

The even stacks (e.g. 114) in the plurality of stacks include first string select switches (e.g. 210) coupled to first string select lines (e.g. SSL1) and second string select switches (e.g. 220) coupled to second string select lines (e.g. ASSL1). The first and second string select switches include the data storage structures 130 on the sidewalls of the even stacks (e.g. 114) in the plurality of stacks. The data storage structures 130 include charge trapping nitride material such as ONO, as described above. The initial threshold voltage distributions for the first and second string select switches including such charge trapping nitride material can be relatively wide, and consequently impact read and program operations. For instance, wider threshold voltage distributions of the first and second string select switches can increase the minimal required voltage on the first and second string select switches. To better control the read and program operations, the initial threshold voltage distributions can be controlled by trimming the first and second string select switches to tighten their threshold voltage distributions. Such trimming operation can be performed with typical ISPP (incremental step pulsed programming) but with a lower bias (e.g. about 16V). The trimming operation can result in tighter threshold voltage distributions of the first and second string select switches, and consequently decrease the minimal required voltage on the first and second string select switches.

Figure 3:
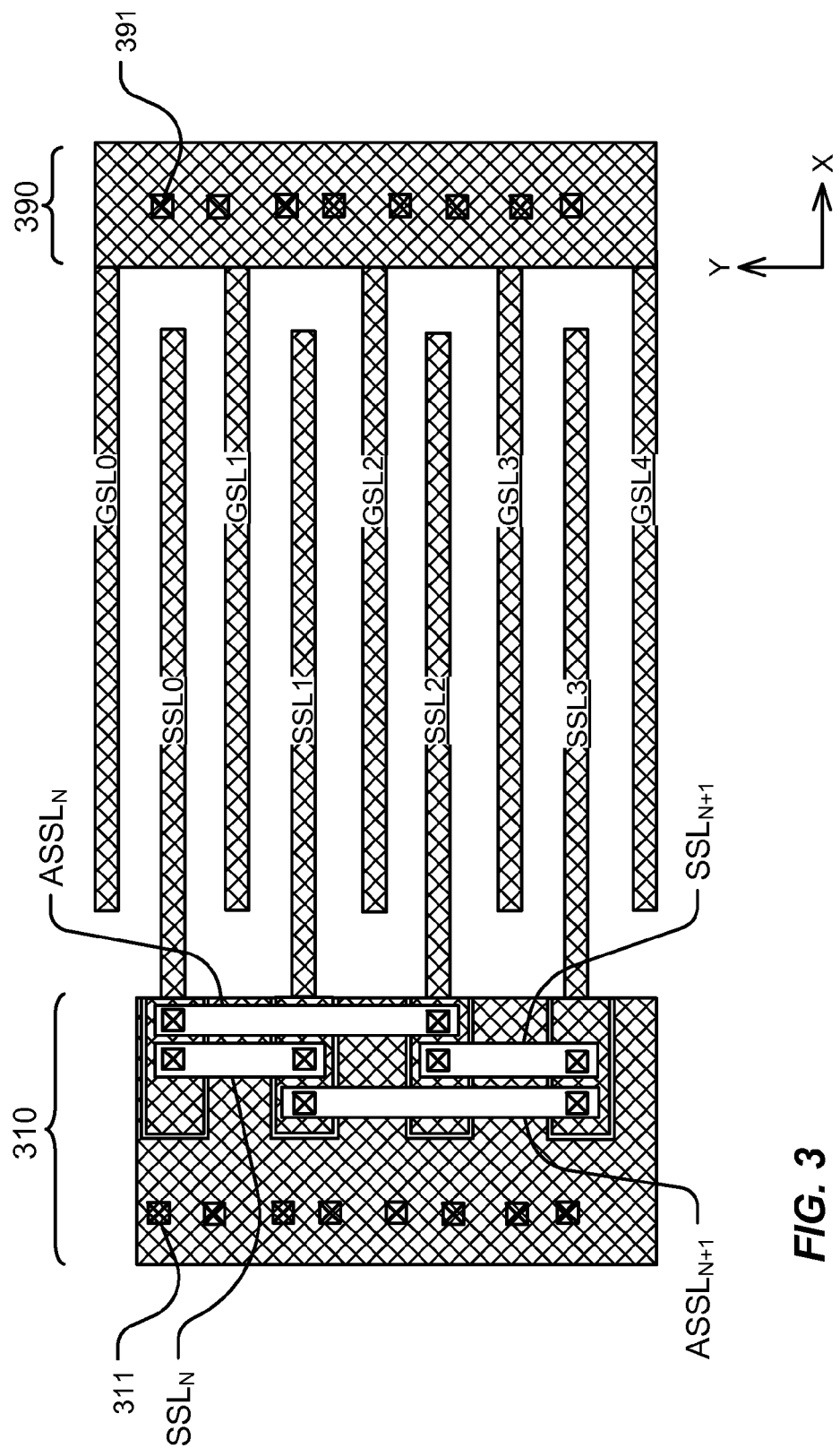
FIG. 3 illustrates a layout view of first linking elements and second linking elements for first string select lines and second string select lines in a 3D NAND as described herein.

FIG. 3 illustrates a layout view of first linking elements and second linking elements for first string select lines (SSL) and second string select lines (ASSL) in a 3D NAND memory as described herein. The first linking elements (e.g. $SSL_N$ and $SSL_{N+1}$) and second linking elements (e.g. $ASSL_N$ and $ASSL_{N+1}$) can be disposed in a first patterned conductor layer (e.g. metal layer 1) over the plurality of stacks, for example at the same metal level as for source reference conductor lines 2040 and 2044 (FIG. 1), and below a metal level (e.g. metal layer 2) for the bit lines (e.g. BL0, BL1 and BL2, FIG. 1).

The pattern of an upper layer in the plurality of stacks of conductive strips is illustrated for a block of stacks of conductive strips in the plurality of stacks of conductive strips. The conductive strips extend from a landing pad area shared in common with other conductive strips in the block. The intermediate and lower layers in the plurality of stacks have the same layout and can be formed in the same patterning step. Each block includes strips extending from a first landing area (e.g. 310) configured for first string select lines (SSL) and second string select lines (ASSL), and underlying even word lines in even stacks of conductive strips, and strips extending from a second landing area (e.g. 390) configured for ground select lines (GSL) and underlying odd word lines in odd stacks of conductive strips.

In one implementation, the first landing area (e.g. 310) can include a single MiLC (minimal incremental layer cost process) module for first string select lines (SSL), second string select lines (ASSL), and underlying even word lines. In an alternative implementation, the first landing area (e.g. 310) can include a first MiLC module for first string select lines (SSL) and second string select lines (ASSL), and a second MiLC module for underlying even word lines.

The plurality of stacks of conductive strips can include K sets of N even stacks, where a current path can be formed from an upper end to a lower end of the semiconductor film on each of the N even stacks and from a lower end to an upper end of the semiconductor film on the corresponding odd stack. The memory device can include K first linking elements (e.g. $SSL_N$ and $SSL_{N+1}$) in a first patterned conductor layer (e.g. metal layer 1) over the plurality of stacks, where each of the K first linking elements connects the first string select lines in the N even stacks in a set in the K sets. The memory device can include N second linking elements (e.g. $ASSL_N$ and $ASSL_{N+1}$) in the first patterned conductor layer (e.g. metal layer 1), where each of the N second linking elements connects K second string select lines, the K second string select lines including the second string select line in one of the N even stacks in each of the K sets.

Figure 4:
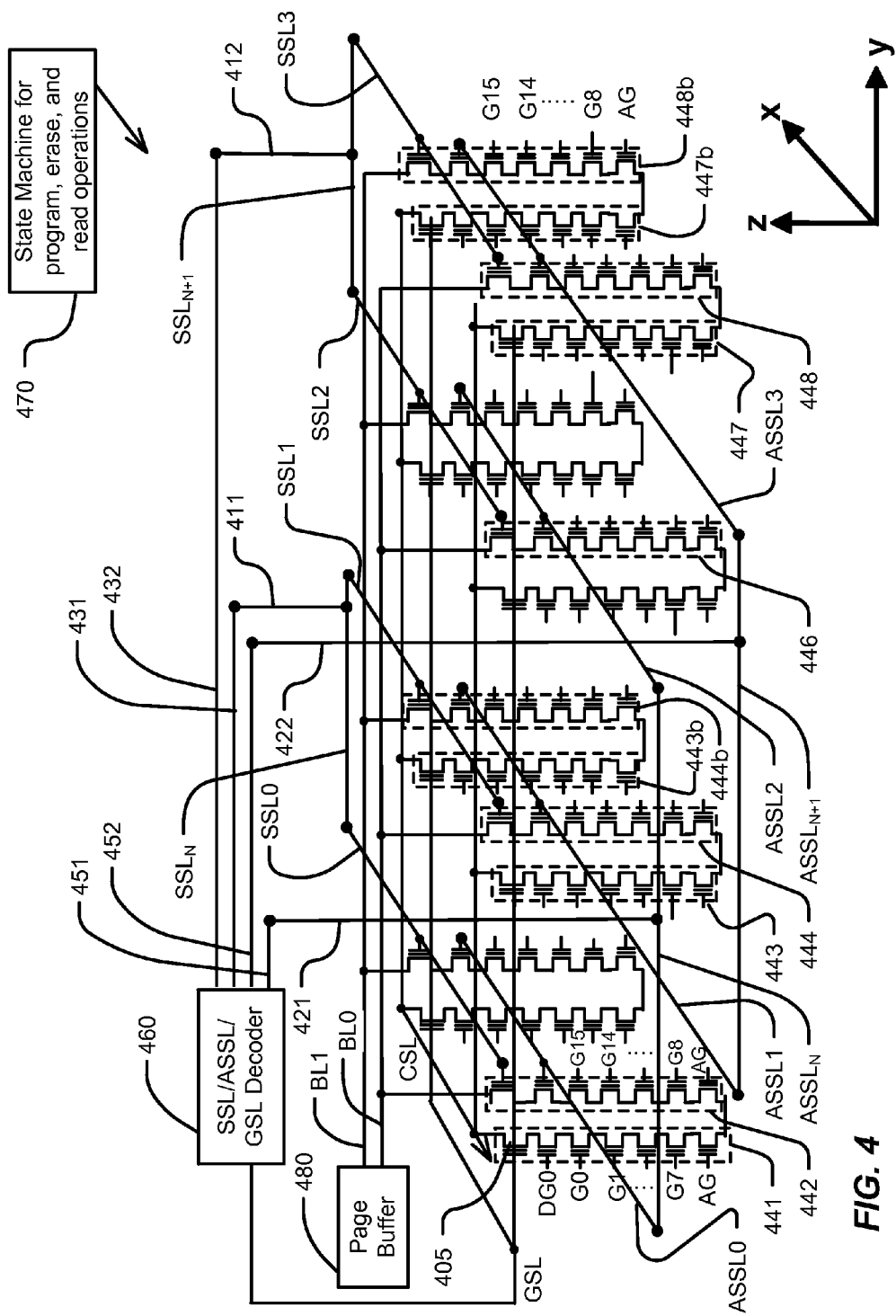
FIG. 4 is a simplified schematic diagram of a 3D NAND memory device as described herein.

Consequently, for (K×N) even stacks, the number of first linking elements and second linking elements required for SSL/ASSL decoding is (K+N). Furthermore, the number of patterned conductor lines connected to the first linking elements and second linking elements via first interlayer connectors and second interlayer connectors, as described in connection with FIG. 4, is also (K+N), where the patterned conductor lines are disposed in a patterned conductor layer or layers (e.g. metal layer 3) higher than the first patterned conductor layer (e.g. metal layer 1). In contrast, if a patterned conductor line is required for each string select line in the (K×N) even stacks, then the number of patterned conductor lines required for the (K×N) even stacks is (K×N). Accordingly, the present technology releases the pitch of the patterned conductor layer or layers (e.g. metal layer 3).

For instance, the plurality of stacks of conductive strips can include 32 even stacks having 32 first string select lines, arranged in 8 sets of 4 even stacks in each set (K=8, N=4). Accordingly, the memory device includes 8 first linking elements, where each of the 8 first linking elements connects 4 first string select lines in a respective set in the 8 sets of 4 even stacks. The memory device also includes 4 second linking elements, where each of the 4 second linking elements connects a respective second string select line in each set in the 8 sets of 4 even stacks.

As shown in the example of FIGS. 1-3, where K=2 and N=2, 4 even stacks (e.g. 1111, 1113, 1115 and 1117) having 4 first string select lines (e.g. SSL0, SSL1, SSL2 and SSL3) are arranged in 2 sets of 2 even stacks in each set. The first set has first string select lines SSL0 and SSL1 and second string select lines ASSL0 and ASSL1 (FIG. 1). The second set has first string select lines SSL2 and SSL3 and second string select lines ASSL2 and ASSL3 (FIG. 2). Accordingly, the memory device includes 2 first linking elements (e.g. $SSL_N$, $SSL_{N+1}$), where first linking element $SSL_N$ connects first string select lines SSL0 and SSL1 in even stacks 1111 and 1113, and first linking elements $SSL_{N+1}$ connects first string select lines SSL2 and SSL3 in even stacks 1115 and 1117. The memory device also includes 2 second linking elements (e.g. $ASSL_N$, $ASSL_{N+1}$), where second linking element $ASSL_N$ connects second string select lines ASSL0 and ASSL2, and second linking element $ASSL_{N+1}$ connects second string select lines ASSL1 and ASSL3.

The diagram schematically illustrates interlayer connectors which go through the upper layer of the stack to make individual connection to each of the underlying layers in a stairstep fashion, for example. The second landing area (e.g. 390) can include eight interlayer connectors (e.g. 391), one for a top layer, six for intermediate layers which include the odd word lines in the odd stacks, and one for the bottom layer which can include the assist gate or another word line, for example.

The first landing area (e.g. 310) can include interlayer connectors for each of first linking elements for the first string select lines (e.g. $SSL_N$ and $SSL_{N+1}$), interlayer connectors for each of second linking elements for the second string select lines (e.g. $ASSL_N$ and $ASSL_{N+1}$), and six interlayer connectors for connection to underlying layers (e.g. 311), including six for the intermediate layers which include the even word lines in the even stacks, and one for the bottom layer which can include the assist gate or another word line, for example.

The conductive strips extending from the second landing area (e.g. 390) are laid out in an interdigitated fashion with the conductive strips extending from the SSL/ASSL area (e.g. 310). As illustrated, the upper layer of the stack includes five GSL lines GSL0-GSL4 and four SSL lines SSL0-SSL3. In addition, four ASSL lines ASSL0-ASSL3 (FIGS. 1 and 2) are disposed below the four corresponding SSL lines SSL0-SSL3. In this layout, all of the GSL lines GSL0-GSL4 are connected in common to a landing area on the top layer of a GSL stack such as the stack on the second landing area 390.

FIG. 4 is a simplified schematic diagram of a 3D NAND memory device as described herein. In this example, eight NAND strings of memory cells are shown, where each of the NAND strings includes an even stack of memory cells and an odd stack of memory cells, connected to form a current path (e.g. 145, FIG. 2) from an upper end to a lower end of a semiconductor film on the even stack, and from a lower end to an upper end of the semiconductor film on the odd stack. The NAND strings are connected to bit lines (e.g. BL0, BL1) at the upper ends of the even stacks, and connected to a common source line (e.g. CSL) at the upper ends of the odd stacks.

As shown in the example of FIG. 4, a first NAND string includes an even stack 442 and an odd stack 441. The even stack 442 includes a first upper strip configured as a first string select line SSL0, a second upper strip configured as a second string select line ASSL0, intermediate strips configured as word lines (e.g. G15, G14, . . . G8), and a bottom strip (e.g. AG), where second upper strips are disposed between the upper strips and the intermediate strips. The odd stack 441 includes intermediate strips configured as word lines (e.g. G7, . . . G1, G0), an upper strip configured as a ground select line GSL, and a bottom strip (e.g. AG), where the intermediate strips are disposed between the ground select line GSL and the bottom strip AG.

Likewise, a second NAND string includes an even stack 444, which includes a first upper strip configured as a first string select line SSL1, and a second upper strip configured as a second string select line ASSL1. A third NAND string includes an even stack 446, which includes a first upper strip configured as a first string select line SSL2, and a second upper strip configured as a second string select line ASSL2. A fourth NAND string includes an even stack 448, which includes a first upper strip configured as a first string select line SSL3, and a second upper strip configured as a second string select line ASSL3.

A plurality of NAND strings of memory cells can includes K sets of N strings. The memory device can include K first string select structures, where each of the K first string select structures is coupled to N first string select lines in a respective set in the K sets of N strings, and N second string select structures, where each of the N second string select structures is coupled to a respective second string select line in each set in the K sets of N strings. A combination of a first string select structure in the K first string select structures and a second string select structure in the N second string select structures selects a string in the K sets of N strings.

As shown in the example of FIG. 4, where K=2 and N=2, first, second, third and fourth NAND strings having 4 first string select lines SSL0, SSL1, SSL2 and SSL3 respectively are arranged in 2 sets of 2 NAND strings in each set. The first set includes the first and second NAND strings, first string select lines SSL0 and SSL1, and second string select lines ASSL0 and ASSL1, respectively. The second set includes the third and fourth NAND strings, first string select lines SSL2 and SSL3, and second string select lines ASSL2 and ASSL3, respectively.

A first string select structure is coupled to two first string select lines (e.g. SSL0 and SSL1) in the first set, where the first string select structure includes a first linking elements $SSL_N$ and a first interlayer connector 411. Another first string select structure is coupled to two other first string select lines (e.g. SSL2 and SSL3) in the second set, where the other first string select structure includes a first linking elements $SSL_{N+1}$ and a first interlayer connector 412.

A second string select structure is coupled to a respective second string select line (e.g. ASSL0) in the first set, and a respective second string select line (e.g. ASSL2) in the second set. Another second string select structure is coupled to a respective second string select line (e.g. ASSL1) in the first set, and a respective second string select line (e.g. ASSL3) in the second set.

A combination of the first string select structure coupled to the first string select lines SSL0 and SSL1, and the second string select structure coupled to the second string select lines ASSL0 and ASSL2 can select the NAND string having the first string select line SSL0 and the second string select line ASSL0. A combination of the first string select structure coupled to the first string select lines SSL0 and SSL1, and the second string select structure coupled to the second string select lines ASSL1 and ASSL3 can select the NAND string having the first string select line SSL1 and the second string select line ASSL1.

Likewise, a combination of the first string select structure coupled to the first string select lines SSL2 and SSL3, and the second string select structure coupled to the second string select lines ASSL0 and ASSL2 can select the NAND string having the first string select line SSL2 and the second string select line ASSL2. A combination of the first string select structure coupled to the first string select lines SSL2 and SSL3, and the second string select structure coupled to the second string select lines ASSL1 and ASSL3 can select the NAND string having the first string select line SSL3 and the second string select line ASSL3.

As shown in the example of FIG. 4, each of the second string select structures is coupled to multiple strings in respective sets of strings in the multiple sets of strings. For instance, a second string select structure including a second linking element $ASSL_{N+1}$ is coupled to multiple strings in a set of strings including a string including stacks 443 and 444 and another string including stacks 443*b* and 444*b*, where both strings are coupled to the same first string select line SSL1 and second string select line ASSL1. The second string select structure including the second linking element $ASSL_{N+1}$ is also coupled to multiple strings in a set of strings including a string including stacks 447 and 448 and another string including stacks 447*b* and 448*b*, where both strings are coupled to the same first string select line SSL3 and second string select line ASSL3.

The K first string select structures can include K first linking elements in a first patterned conductor layer over the plurality of stacks of conductive strips, where each of the K first linking elements connects N first string select lines in a respective set in the K sets of N strings. The N second string select structures can include N second linking elements in the first patterned conductor layer, where each of the N second linking elements connects a respective second string select line in each set in the K sets of N strings.

As shown in the example of FIG. 4, the first linking element $SSL_N$ connects the first string select lines SSL0 and SSL1 in the first set of NAND strings, and the first linking element $SSL_{N+1}$ connects the first string select lines SSL2 and SSL3 in the second set of NAND strings. The second linking element $ASSL_N$ connects the respective second string select line ASSL0 in the first set and the respective second string select line ASSL2 in the second set. The second linking element $ASSL_{N+1}$ connects the respective second string select line ASSL1 in the first set and the respective second string select line ASSL3 in the second set. The first linking elements and the second linking elements can be disposed in a first patterned conductor layer over the plurality of stacks of conductive strips (e.g. the metal layer 1).

The K first string select structures can include first interlayer connectors connecting K first patterned conductor lines to the K first linking elements respectively. The N second string select structures include second interlayer connectors connecting N second patterned conductor lines to the N second linking elements respectively. The K first patterned conductor lines and the N second patterned conductor lines can be disposed in a patterned conductor layer or layers (e.g. metal layer 3) higher than the first patterned conductor layer, connecting the K sets of N strings to a string decoder (e.g. 460, FIG. 4) for decoding the first string select lines (SSL) and the second string select lines (ASSL). The string decoder (e.g. 460) can also be connected to the ground select line (GSL).

As shown in the example of FIG. 4, first interlayer connectors 411 and 412 connect first patterned conductor lines 431 and 432 to the first linking elements $SSL_N$ and $SSL_{N+1}$, respectively. Second interlayer connectors 421 and 422 connect second patterned conductor lines 451 and 452 to the second linking elements $ASSL_N$ and $ASSL_{N+1}$, respectively.

Block select transistors are arranged at upper ends of the odd stacks in the NAND strings. For example, block select switch 405 is arranged at the upper end of the odd stack 441 in the first NAND string. A ground select line GSL is connected to the gates of the block select switches. The word lines WLs are in electrical communication with a word line decoder (e.g. even/odd level decoder 850, FIG. 8) to receive bias voltages during operations described herein.

The block select transistors are used to selectively couple the upper ends of the odd stacks in the block to a common source line CSL. The common source line CSL receives bias voltages from the bias circuit (e.g. 820, FIG. 8) during operations described herein. In some operations described herein, the CSL is biased to a reference voltage that is higher in absolute magnitude than that of a bit line coupled to the opposite end of a NAND string, rather than in the more traditional "source" role.

Bit lines BL0 and BL1 are coupled to additional blocks (not shown) in the array and extend to page buffer 480. A state machine 470 is shown that is configured to control the memory array and supporting circuitry to perform program, block erase, sub-block erase and read operations.

Figure 5:
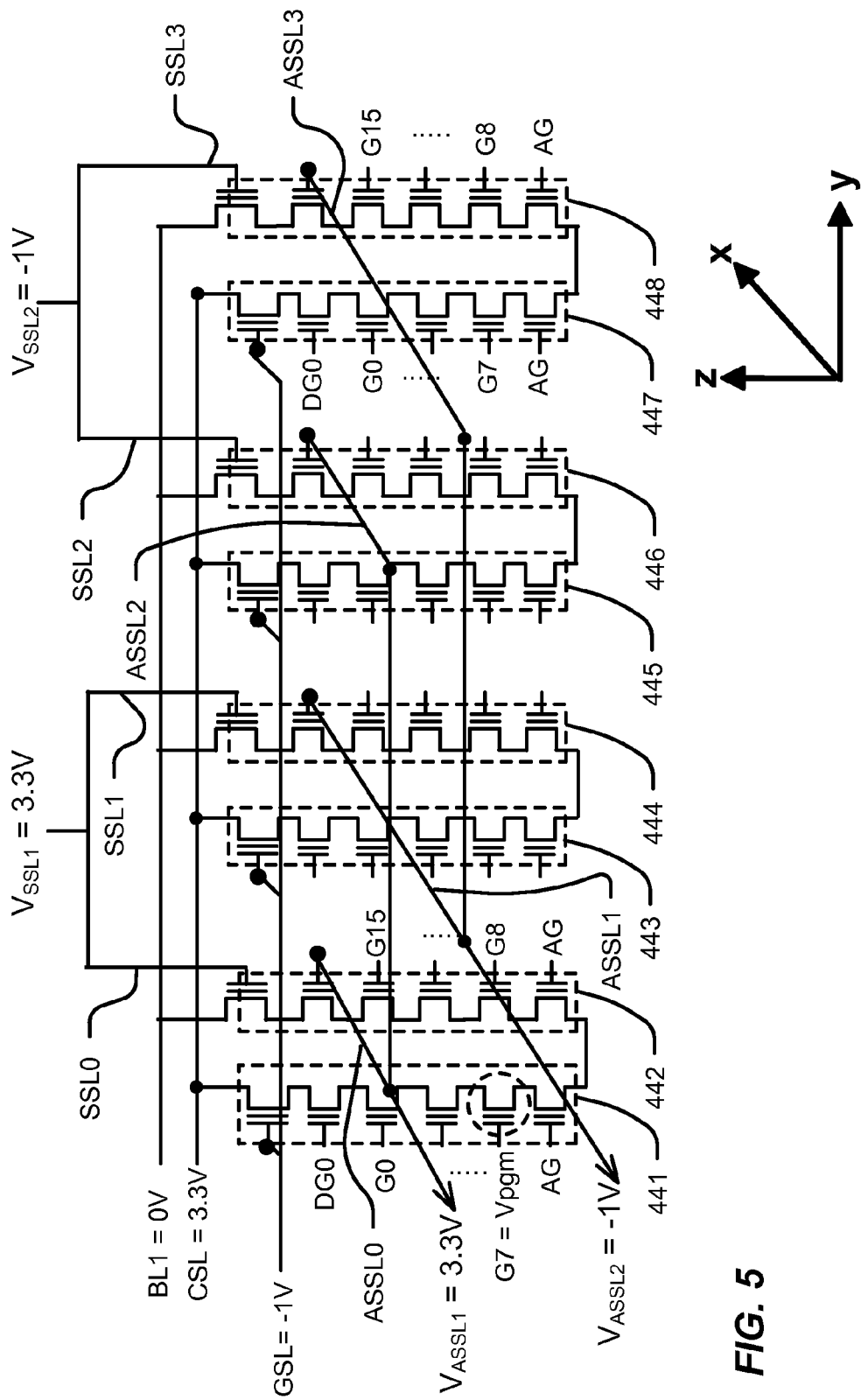
FIG. 5 illustrates portions of the simplified schematic diagram in FIG. 4 along the Y-direction, showing bias voltages on the first string select lines and second string select lines for selecting and deselecting strings of memory cells.

FIG. 5 illustrates portions of the simplified schematic diagram in FIG. 4 along the Y-direction, showing bias voltages on the first string select lines and second string select lines for selecting and deselecting strings of memory cells. Like elements in FIG. 5 are referred to with like reference numerals as in FIG. 4. In this example, four NAND strings are shown, where each of the NAND strings includes an even stack of memory cells and an odd stack of memory cells, connected to form and a current path (e.g. 145, FIG. 2) from an upper end to a lower end of a semiconductor film on the even stack, and from a lower end to an upper end of the semiconductor film on the odd stack. The NAND strings are connected to a bit line (e.g. BL1) at the upper ends of the even stacks, and connected to a common source line (e.g. CSL) at the upper ends of the odd stacks.

As shown in the example of FIG. 5, a first NAND string includes an odd stack 441, and an even stack 442, which includes a first upper strip configured as a first string select line SSL0, and a second upper strip configured as a second string select line ASSL0. Likewise, a second NAND string includes an odd stack 443, and an even stack 444, which includes a first upper strip configured as a first string select line SSL1, and a second upper strip configured as a second string select line ASSL1. A third NAND string includes an odd stack 445, and an even stack 446, which includes a first upper strip configured as a first string select line SSL2, and a second upper strip configured as a second string select line ASSL2. A fourth NAND string includes an odd stack 447, and an even stack 448, which includes a first upper strip configured as a first string select line SSL3, and a second upper strip configured as a second string select line ASSL3.

Each of the even stacks (e.g. 442, 444, 446, 448) includes intermediate strips configured as word lines (e.g. G15, . . . G8), and a bottom strip (e.g. AG), where second upper strips are disposed between the upper strips and the intermediate strips. Each of the odd stacks (e.g. 441, 443, 445, 447) includes intermediate strips configured as word lines (e.g. G7, . . . G0), an upper strip configured as a ground select line GSL, and a bottom strip (e.g. AG), where the intermediate strips are disposed between the ground select line GSL and the bottom strip AG.

As shown in the example of FIG. 5, where K=2 and N=2, first, second, third and fourth NAND strings having 4 first string select lines SSL0, SSL1, SSL2 and SSL3 respectively are arranged in 2 sets of 2 NAND strings in each set. The first set includes the first and second NAND strings including even stacks 442 and 444, first string select lines SSL0 and SSL1, and second string select lines ASSL0 and ASSL1, respectively. The second set includes the third and fourth NAND strings including even stacks 446 and 448, first string select lines SSL2 and SSL3, and second string select lines ASSL2 and ASSL3, respectively.

In order to select a particular string in the plurality of strings of memory cells, a first turn-on voltage can be applied to a first string select line in the first string select lines coupled to the particular string, and a second turn-on voltage can be applied to a second string select line in the second string select lines coupled to the particular string. The second turn-on voltage can be lower than the first turn-on voltage.

As shown in the example of FIG. 5, in order to select the first NAND string including an even stack 442 and an odd stack 441, a first turn-on voltage (e.g. $V_{SSL1}$=3.3V) can be applied to the first string select line (e.g. SSL0) coupled to the first NAND string, and a second turn-on voltage (e.g. $V_{ASSL1}$=3.3V) can be applied to the second string select line (e.g. ASSL0) coupled to the first NAND string. To program a memory cell (e.g. G7) on the selected first NAND string, a program voltage Vpgm can be applied to the memory cell G7.

In order to deselect a particular string in the plurality of strings of memory cells, a turn-off voltage can be applied to one or both of a first string select line in the first string select lines coupled to the particular string, and a second string select line in the plurality of second string select lines coupled to the particular string.

As shown in the example of FIG. 5, in order to deselect the second NAND string including an even stack 444 and an odd stack 443, a turn-off voltage (e.g. $V_{ASSL2}$=−1V) can be applied to the second string select line (e.g. ASSL1) coupled to the second NAND string. In order to deselect the third NAND string including an even stack 446 and an odd stack 445, a turn-off voltage (e.g. $V_{SSL2}$=−1V) can be applied to the second string select line (e.g. ASSL2) coupled to the third NAND string. In order to deselect the fourth NAND string including an even stack 448 and an odd stack 447, a turn-off voltage (e.g. $V_{SSL2}$=−1V) can be applied to the first string select line (e.g. SSL3) coupled to the fourth NAND string, and a turn-off voltage (e.g. $V_{ASSL2}$=−1V) can be applied to the second string select line (e.g. ASSL3) coupled to the fourth NAND string.

Representative program, read and erase bias voltages on the first string select lines (SSL) and the second string select lines (ASSL) can be understood based on the following table.

| Signals | Program | Read | Erase |
| --- | --- | --- | --- |
| Selected Bit Line | GND | Vread | Vbl_ers |
| Deselected Bit Line | VCC | GND | Vbl_ers |
| Selected SSL | VCC | VCC | Vssl_ers |
| Deselected SSL | GND | GND | Vssl_ers |
| Selected ASSL | VCC or Vpgm | VCC or Vpgm | Vssl_ers |
| Deselected ASSL | GND | GND | Vssl_ers |
| Selected WL | Vpgm | Vwl | Vers |
| Deselected WL | Vpass | Vpass_r | Vers |
| GSL | GND | VCC | Vssl_ers |
| CSL | VCC | GND | Vbl_ers |

For example, to program a selected memory cell (e.g. G7) on the first NAND string including an even stack 442 and an odd stack 441, a selected bit line coupled to the memory cell (e.g. BL1) can be biased at a ground voltage (e.g. GND=0V), a selected first string select line (e.g. SSL0) coupled to the first NAND string can be biased at a first turn-on voltage (e.g. $V_{SSL1}$=VCC=3.3V), and a selected second string select line (e.g. ASSL0) coupled to the first NAND string can be biased at a second turn-on voltage (e.g. $V_{ASSL1}$=VCC=3.3V), and a program voltage (Vpgm=20V to 25V) can be applied to the selected memory cell G7.

In one implementation, the second turn-on voltage can be lower than the first turn-on voltage, such as at the program voltage (e.g. $V_{ASSL1}$=Vpgm).

A program pass voltage (e.g. Vpass=about 10V) can be applied to the unselected memory cells on the first NAND string (e.g. G15 . . . G8, G0). The ground select line GSL coupled to the first NAND string can be biased at the ground voltage (e.g. GND=0V), and the common source line CSL coupled to the first NAND string can be biased at a supply voltage (e.g. VCC=2.5V to 3.3V).

To read a selected memory cell (e.g. G7) on the first NAND string, a selected bit line coupled to the memory cell (e.g. BL1) can be biased at a channel-side read voltage (e.g. Vread=0.6V to 1V), a selected first string select line (e.g. SSL0) and a selected second string select line (e.g. ASSL0) are biased at the same voltages as for programming the selected memory cell, and a word line read voltage (e.g. Vwl=0V) can be applied to the selected memory cell G7. A read pass voltage (e.g. Vpass_r=5-8V) can be applied to the unselected memory cells on the first NAND string (e.g. G15 . . . G8, G0). The ground select line GSL coupled to the first NAND string can be biased at supply voltage (e.g. VCC=2.5V to 3.3V), and the common source line CSL coupled to the first NAND string can be biased at the ground voltage (e.g. GND=0V).

To erase a plurality of strings of memory cells, bit lines and the common source line CSL coupled to the strings can be applied a channel-side erase voltage (e.g. Vbl_ers=14 to 20V), first string select lines, second string select lines, and the ground select line GSL coupled to the strings can be applied a string select erase voltage (e.g. Vssl_ers=6 to 12V), and word lines coupled to the strings can be applied a word line erase voltage (e.g. Vers=0V).

Figure 6A:
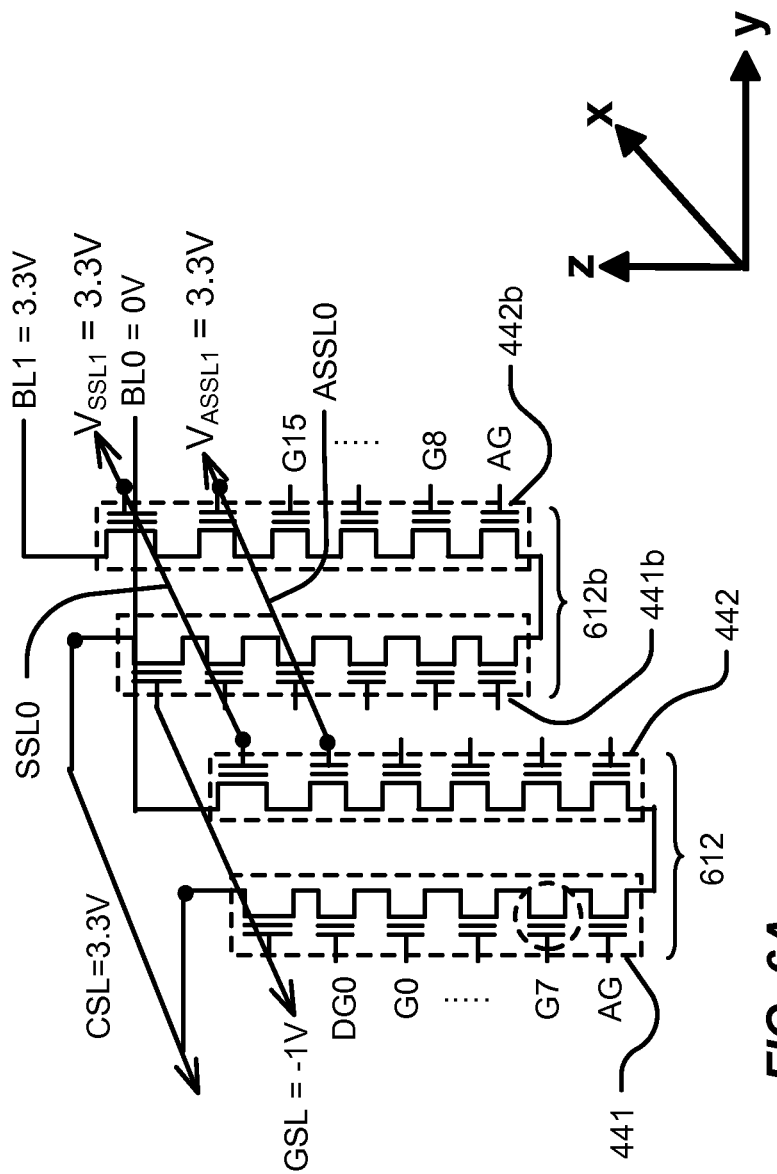

FIGS. 6A, 6B and 6C illustrate portions of the simplified schematic diagram in FIG. 4 along the X-direction, showing bias voltages on the first string select lines and second string select lines for selecting and deselecting strings of memory cells. FIG. 6A illustrates a selected page of multiple NAND strings, while FIG. 6B illustrates a deselected page of multiple NAND strings, and FIG. 6C illustrates another deselected page of multiple NAND strings. Like elements in FIGS. 6A, 6B and 6C illustrate are referred to with like reference numerals as in FIG. 4.

As shown in the example of FIG. 6A, a NAND string 612 includes an odd stack 441, and an even stack 442, which includes a first upper strip configured as a first string select line SSL0, and a second upper strip configured as a second string select line ASSL0. A NAND string 612b includes an odd stack 441b, and an even stack 442b, which shares the first string select line SSL0 and the second string select line ASSL0 with the NAND string 612. The NAND strings 612 and 612b are representative of a page of multiple NAND strings sharing at least the first string select line SSL0 and the second string select line ASSL0 with the NAND strings 612 and 612b.

The NAND string 612 is connected to a first bit line (e.g. BL0) at the upper end of the even stack 442 in the NAND string 612. The NAND string 612b is connected to a second bit line (e.g. BL1) at the upper end of the even stack 442b in the NAND string 612b. The NAND strings 612 and 612b are connected to the ground select line and the common source line (e.g. CSL) at the upper ends of the odd stacks (e.g. 441 and 441b) in the NAND strings 612 and 612b.

In order to select a page of multiple NAND strings including the NAND strings 612 and 612b, a first turn-on voltage (e.g. $V_{SSL1}$=3.3V) can be applied to the first string select line (e.g. SSL0) coupled to the multiple NAND strings in the page, and a second turn-on voltage (e.g. $V_{ASSL1}$=3.3V) can be applied to the second string select line (e.g. ASSL0) coupled to the multiple NAND strings in the page. To select the NAND string 612 in the selected page of multiple NAND strings, the bit line coupled to the NAND string 612 (e.g. BL0) can be biased at a ground voltage (e.g. GND=0V). To program a memory cell (e.g. G7) on the selected NAND string 612, a program voltage Vpgm can be applied to the memory cell G7, while a program pass voltage Vpass is applied to deselected memory cells (e.g. G15-G8) on the selected NAND string 612.

To deselect the NAND string 612b in the selected page of multiple NAND strings, the bit line coupled to the NAND string 612b (e.g. BL1) can be biased at a supply voltage (e.g. VCC=2.5V to 3.3V).

As shown in the example of FIG. 6B, a NAND string 656 includes an odd stack 445, and an even stack 446, which includes a first upper strip configured as a first string select line SSL2, and a second upper strip configured as a second string select line ASSL2. A NAND string 656b includes an odd stack 445b, and an even stack 446b, which shares the first string select line SSL2 and the second string select line ASSL2 with the NAND string 656. The NAND strings 656 and 656b are representative of a page of multiple NAND strings sharing at least the first string select line SSL2 and the second string select line ASSL2 with the NAND strings 656 and 656b.

The NAND string 656 is connected to a first bit line (e.g. BL0) at the upper end of the even stack 446 in the NAND string 656. The NAND string 656b is connected to a second bit line (e.g. BL1) at the upper end of the even stack 446b in the NAND string 656b. The NAND strings 656 and 656b are connected to the ground select line GSL and the common source line (e.g. CSL) at the upper ends of the odd stacks (e.g. 445 and 445b) in the NAND strings 656 and 656b.

In order to deselect a page of multiple NAND strings including the NAND strings 656 and 656b, a turn-off voltage (e.g. $V_{SSL2}$=−1V) can be applied to the first string select line (e.g. SSL2) coupled to the multiple NAND strings in the page, while a voltage (e.g. $V_{ASSL1}$=3.3V) higher than the turn-off voltage can be applied to the second string select line (e.g. ASSL2) coupled to the multiple NAND strings in the page.

As shown in the example of FIG. 6C, a NAND string 678 includes an odd stack 447, and an even stack 448, which includes a first upper strip configured as a first string select line SSL3, and a second upper strip configured as a second string select line ASSL3. A NAND string 678b includes an odd stack 447b, and an even stack 448b, which shares the first string select line SSL3 and the second string select line ASSL3 with the NAND string 678. The NAND strings 678 and 678b are representative of a page of multiple NAND strings sharing at least the first string select line SSL3 and the second string select line ASSL3 with the NAND strings 678 and 678b.

The NAND string 678 is connected to a first bit line (e.g. BL0) at the upper end of the even stack 448 in the NAND string 678. The NAND string 678b is connected to a second bit line (e.g. BL1) at the upper end of the even stack 448b in the NAND string 678b. The NAND strings 678 and 678b are connected to the ground select line GSL and the common source line (e.g. CSL) at the upper ends of the odd stacks (e.g. 447 and 447b) in the NAND strings 678 and 678b.

In order to deselect a page of multiple NAND strings including the NAND strings 678 and 678b, a turn-off voltage (e.g. $V_{SSL2}$=−1V) can be applied to the first string select line (e.g. SSL3) coupled to the multiple NAND strings in the page, and the turn-off voltage (e.g. $V_{ASSL2}$=−1V) can be applied to the second string select line (e.g. ASSL3) coupled to the multiple NAND strings in the page.

As shown in the examples of FIGS. 6B and 6C, in order to deselect a particular string in the plurality of strings, a turn-off voltage can be applied to one or both of a first string select line coupled to the particular string, and a second string select line coupled to the particular string.

Figure 7:
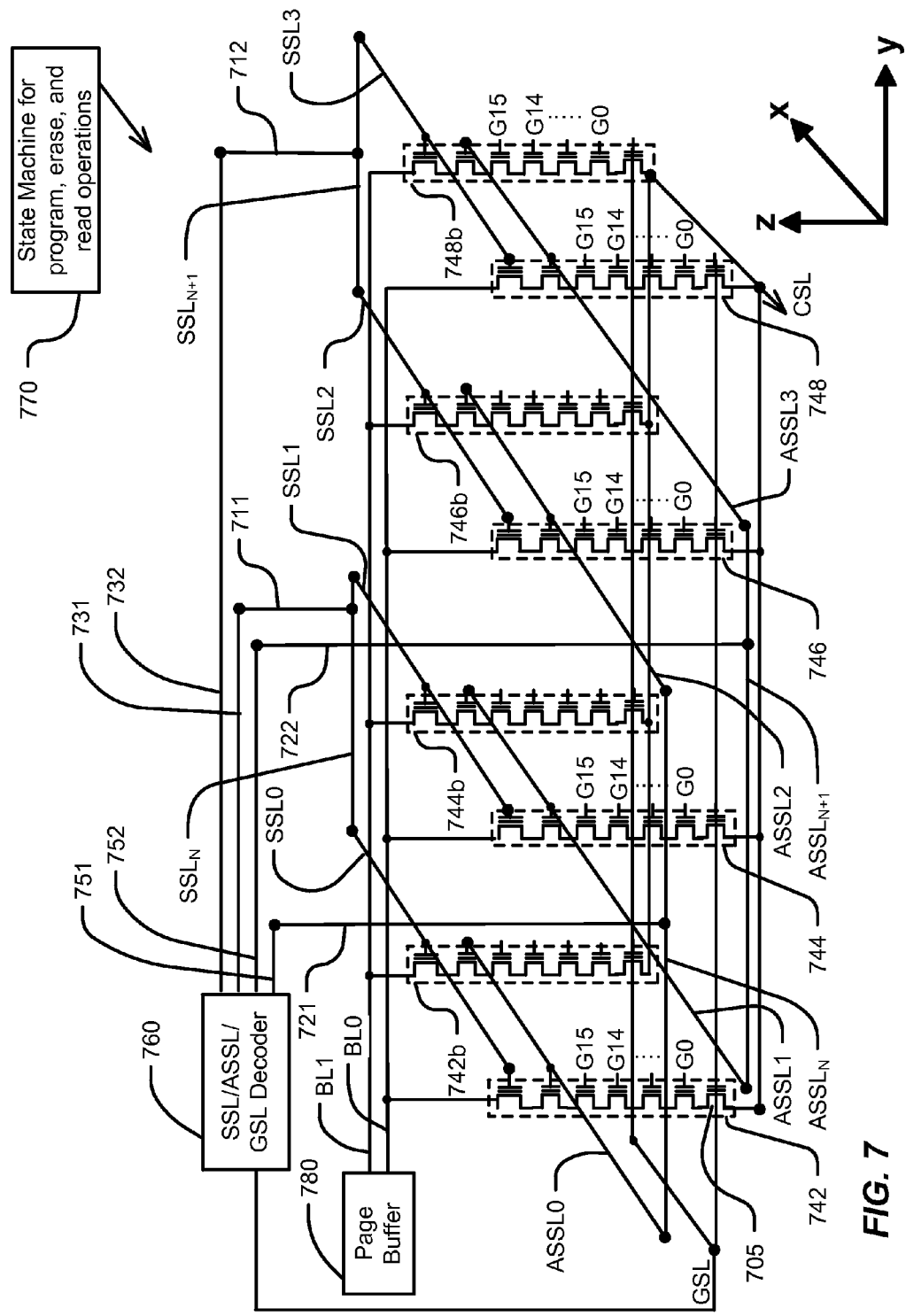
FIG. 7 is a simplified schematic diagram of an alternative implementation of the present technology.

FIG. 7 is a simplified schematic diagram of an alternative implementation of the present technology. Description about the 3D NAND memory device shown in FIGS. 1-6 is generally applicable to the alternative implementation shown in FIG. 7. In particular, description about the first and second string select lines, the first and second linking elements, the first and second interlayer connectors, and the first and second patterned conductor lines in the first-described implementation shown in FIGS. 1-6 is applicable to the alternative implementation shown in FIG. 7.

The 3D NAND memory device shown in FIGS. 1-6 has even stacks of conductive strips including the first upper strips configured as the first string select lines (SSL) and the second upper strips configured as the second string select lines (ASSL), and odd stacks of conductive strips including upper strips configured as ground select lines. In comparison, the alternative implementation has stacks of conductive strips including the first upper strips configured as the first string select lines (SSL) and the second upper strips configured as the second string select lines (ASSL), and bottom strips configured as ground select lines in the same stacks as the first string select lines and the second string select lines.

NAND strings of memory cells shown in FIG. 7 are representative of a plurality of NAND strings of memory cells in the memory device. Two NAND strings of memory cells (e.g. 742 and 742b, 744 and 744b, 746 and 746b, 748 and 748b) are shown for each stack, which are representative of multiple NAND strings in a stack. NAND strings are connected to respective bit lines (e.g. BL0, BL1) at upper ends of the stacks.

As shown in the example of FIG. 7, a first NAND string 742 includes a first upper strip configured as a first string select line SSL0, a second upper strip configured as a second string select line ASSL0, intermediate strips configured as word lines (e.g. G15, G14, . . . G0), and a bottom strip configured as a ground select line GSL, disposed below the intermediate strips, where the second upper strips are disposed between the upper strips and the intermediate strips.

Likewise, a second NAND string 744 includes a first upper strip configured as a first string select line SSL1, and a second upper strip configured as a second string select line ASSL1. A third NAND string 746 includes a first upper strip configured as a first string select line SSL2, and a second upper strip configured as a second string select line ASSL2. A fourth NAND string 748 includes a first upper strip configured as a first string select line SSL3, and a second upper strip configured as a second string select line ASSL3.

Data storage structures are disposed on sidewalls of the stacks in the plurality of stacks. Semiconductor films are disposed on the data storage structures on the sidewalls of the stacks, forming a current path is formed from an upper end to a lower end of the semiconductor films on the stacks.

As shown in the example of FIG. 7, where K=2 and N=2, first, second, third and fourth NAND strings having 4 first string select lines SSL0, SSL1, SSL2 and SSL3 respectively are arranged into 2 sets of 2 NAND strings in each set. The first set includes the first and second NAND strings, first string select lines SSL0 and SSL1, and second string select lines ASSL0 and ASSL1, respectively. The second set includes the third and fourth NAND strings, first string select lines SSL2 and SSL3, and second string select lines ASSL2 and ASSL3, respectively.

A first string select structure is coupled to two first string select lines (e.g. SSL0 and SSL1) in the first set, where the first string select structure includes a first linking elements $SSL_N$ and a first interlayer connector 711. Another first string select structure is coupled to two other first string select lines (e.g. SSL2 and SSL3) in the second set, where the other first string select structure includes a first linking elements $SSL_{N+1}$ and a first interlayer connector 712.

A second string select structure is coupled to a respective second string select line (e.g. ASSL0) in the first set, and a respective second string select line (e.g. ASSL2) in the second set. Another second string select structure is coupled to a respective second string select line (e.g. ASSL1) in the first set, and a respective second string select line (e.g. ASSL3) in the second set.

A combination of the first string select structure coupled to the first string select lines SSL0 and SSL1, and the second string select structure coupled to the second string select lines ASSL0 and ASSL2 can select the NAND string having the first string select line SSL0 and the second string select line ASSL0. A combination of the first string select structure coupled to the first string select lines SSL0 and SSL1, and the second string select structure coupled to the second string select lines ASSL1 and ASSL3 can select the NAND string having the first string select line SSL1 and the second string select line ASSL1.

Likewise, a combination of the first string select structure coupled to the first string select lines SSL2 and SSL3, and the second string select structure coupled to the second string select lines ASSL0 and ASSL2 can select the NAND string having the first string select line SSL2 and the second string select line ASSL2. A combination of the first string select structure coupled to the first string select lines SSL2 and SSL3, and the second string select structure coupled to the second string select lines ASSL1 and ASSL3 can select the NAND string having the first string select line SSL3 and the second string select line ASSL3.

As shown in the example of FIG. 7, the first linking element $SSL_N$ connects the first string select lines SSL0 and SSL1 in the first set of NAND strings, and the first linking element $SSL_{N+1}$ connects the first string select lines SSL2 and SSL3 in the second set of NAND strings. The second linking element $ASSL_N$ connects the respective second string select line ASSL0 in the first set and the respective second string select line ASSL2 in the second set. The second linking element $ASSL_{N+1}$ connects the respective second string select line ASSL1 in the first set and the respective second string select line ASSL3 in the second set. The first linking elements and the second linking elements can be disposed in a first patterned conductor layer over the plurality of stacks of conductive strips (e.g. the metal layer 1).

As shown in the example of FIG. 7, first interlayer connectors 711 and 712 connect first patterned conductor lines 731 and 732 to the first linking elements $SSL_N$ and $SSL_{N+1}$, respectively. Second interlayer connectors 721 and 722 connect second patterned conductor lines 751 and 752 to the second linking elements $ASSL_N$ and $ASSL_{N+1}$, respectively. The first patterned conductor lines and the second patterned conductor lines can be disposed in a patterned conductor layer or layers (e.g. metal layer 3) higher than the first patterned conductor layer, connecting the sets of NAND strings to a string decoder (e.g. 760) for decoding the first string select lines (SSL) and the second string select lines (ASSL). The string decoder (e.g. 760) can also be connected to the ground select line (GSL).

Block select transistors are arranged at lower ends of the NAND strings opposite upper ends of the first string select lines (e.g. SSL0). For example, block select switch 705 is arranged at the lower end of the NAND string 742. A ground select line GSL is connected to the gate of the block select switch 705. The word lines WLs are in electrical communication with a word line decoder (e.g. even/odd level decoder 850, FIG. 8) to receive bias voltages during operations described herein.

The block select transistors are used to selectively couple the lower ends of the NAND strings in the block to a common source line CSL. The common source line CSL receives bias voltages from the bias circuit (e.g. 820, FIG. 8) during operations described herein. In some operations described herein, the CSL is biased to a reference voltage that is higher in absolute magnitude than that of a bit line coupled to the opposite end of a NAND string, rather than in the more traditional "source" role.

Bit lines BL0 and BL1 are coupled to additional blocks (not shown) in the array and extend to page buffer 780. A state machine 770 is shown that is configured to control the memory array and supporting circuitry to perform program, block erase, sub-block erase and read operations.

Figure 8:
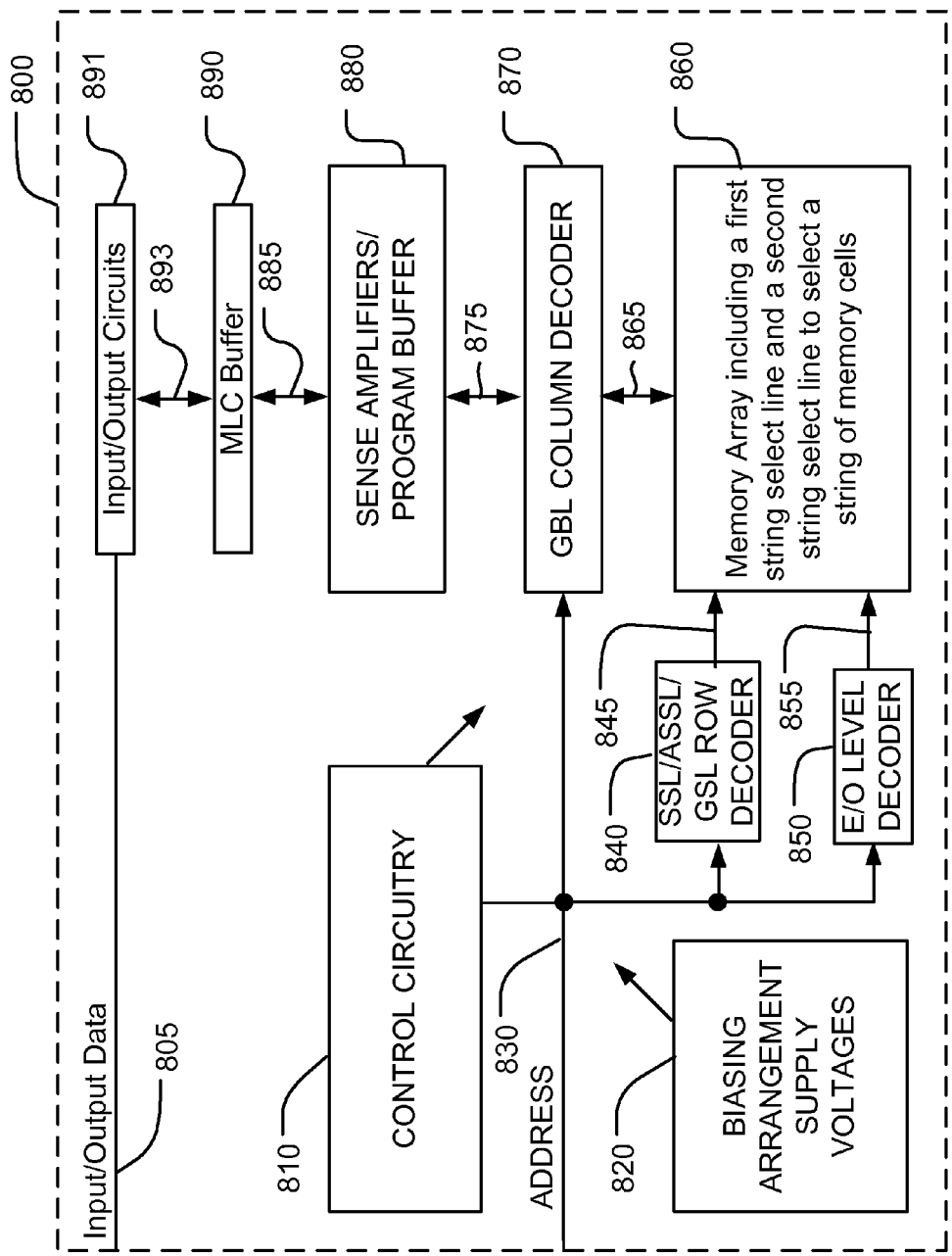
FIG. 8 is a simplified chip block diagram of an integrated circuit including a 3D, vertical thin-channel film NAND array.

FIG. 8 is a simplified chip block diagram of an integrated circuit 800 including a 3D, vertical thin-channel film NAND array. The integrated circuit 800 includes a memory array 860 including one or more memory blocks as described herein, that use a first string select line (SSL) and a second string select line (ASSL) to select a string of memory cells in a block of memory cells.

An SSL/ASSL/GSL decoder 840 is coupled to a plurality of SSL/ASSL/GSL lines 845, arranged in the memory array 860. An even/odd level decoder 850 is coupled to a plurality of even/odd word lines 855. A global bit line column decoder 870 is coupled to a plurality of global bit lines 865 arranged along columns in the memory array 860 for reading data from and writing data to the memory array 860. Addresses are supplied on bus 830 from control circuitry 810 to the global bit line column decoder 870, the SSL/ASSL/GSL decoder 840 and the even/odd level decoder 850. Sense amplifier and program buffer circuits 880 are coupled to the global bit line column decoder 870, in this example via first data lines 875. The program buffer in circuits 880 can store program codes for multiple-level programming, or values that are a function of the program codes, to indicate program or inhibit states for selected bit lines. The global bit line column decoder 870 can include circuits for selectively applying program and inhibit voltages to bit lines in the memory in response to the data values in the program buffer.

Sensed data from the sense amplifier/program buffer circuits are supplied via second data lines 885 to multi-level data buffer 890, which is in turn coupled to input/output circuits 891 via a data path 893. Also, input data is applied in this example to the multi-level data buffer 890 for use in support of multiple-level program operations for each of the independent sides of the independent double gate cells in the array.

Input/output circuits 891 drive the data to destinations external to the integrated circuit 801. Input/output data and control signals are moved via data bus 805 between the input/output circuits 891, the control circuitry 810 and input/output ports on the integrated circuit 801 or other data sources internal or external to the integrated circuit 801, such as a general purpose processor or special purpose application circuitry, or a combination of modules providing system-on-a-chip functionality supported by the memory array 860.

In the example shown in FIG. 8, control circuitry 810, using a bias arrangement state machine (e.g. 470, FIG. 4; 770, FIG. 7), controls the application of supply voltages generated or provided through the voltage supply or supplies in block 820, such as read, erase, verify and program bias voltages. The control circuitry 810 is coupled to the first string select lines, the second string select lines, the multi-level data buffer 890, and the memory array 860. The control circuitry 810 includes logic to control multiple-level program operations. In embodiments supporting the vertical thin-channel film NAND structures described herein, the logic is configured to perform the method of:

selecting a particular string in the plurality of strings by applying a first turn-on voltage to a first string select line coupled to the particular string, and a second turn-on voltage to a second string select line coupled to the particular string, where the second turn-on voltage can be lower than the first turn-on voltage; and deselecting a particular string in the plurality of strings by applying a turn-off voltage to one or both of a first string select line coupled to the particular string, and a second string select line coupled to the particular string.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell.

The control circuitry 810 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 860 can comprise charge trapping memory cells configured to store multiple bits per cell, by the establishment of multiple program levels that correspond to amounts of charge stored, which in turn establish memory cell threshold voltages $V_T$. Single-bit-per-cell embodiments can include the structures described herein.

While the present technology is disclosed by reference to the preferred embodiments and examples detailed herein, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory device including a plurality of strings of memory cells, comprising:
   a plurality of stacks of conductive strips, including first upper strips configured as first string select lines for the strings in the plurality of strings, second upper strips configured as second string select lines for the strings in the plurality of strings, and intermediate strips configured as word lines for the strings in the plurality of strings, the strings of memory cells being disposed vertically between stacks of conductive strips in the plurality of stacks; and
   control circuitry coupled to the first string select lines and the second string select lines, and configured to select a particular string in the plurality of strings by applying a first turn-on voltage to a first string select line in the first string select lines coupled to the particular string, and a second turn-on voltage to a second string select line in the second string select lines coupled to the particular string.

2. The memory device of claim 1, wherein the second upper strips are disposed between the upper strips and the intermediate strips.

3. The memory device of claim 1, wherein the plurality of strings of memory cells includes multiple sets of strings, comprising:
   first string select structures, each of the first string select structures coupled to first string select lines in a respective set of strings in the multiple sets of strings; and
   second string select structures, each of the second string select structures coupled to a respective second string select line in each set of strings in the multiple sets of strings,
   wherein a combination of a first string select structure in the first string select structures and a second string select structure in the second string select structures selects a string in the multiple sets of strings.

4. The memory device of claim 3, wherein each of the second string select structures is coupled to multiple strings in respective sets of strings in the multiple sets of strings.

5. The memory device of claim 1, wherein the plurality of strings of memory cells includes K sets of N strings, comprising:

K first string select structures, each of the K first string select structures coupled to N first string select lines in a respective set in the K sets of N strings; and N second string select structures, each of the N second string select structures coupled to a respective second string select line in each set of strings in the K sets of N strings, wherein a combination of a first string select structure in the K first string select structures and a second string select structure in the N second string select structures selects a string in the K sets of N strings.

6. The memory device of claim 5, wherein:

the K first string select structures include K first linking elements in a first patterned conductor layer over the plurality of stacks of conductive strips, each of the K first linking elements connecting N first string select lines in a respective set in the K sets of N strings; and the N second string select structures include N second linking elements in the first patterned conductor layer, each of the N second linking elements connecting a respective second string select line in each set in the K sets of N strings.

7. The memory device of claim 6, wherein:

the K first string select structures include first interlayer connectors connecting K first patterned conductor lines to the K first linking elements respectively;

the N second string select structures include second interlayer connectors connecting N second patterned conductor lines to the N second linking elements respectively; and the K first patterned conductor lines and the N second patterned conductor lines are disposed in a patterned conductor layer or layers higher than the first patterned conductor layer, connecting the K sets of N strings to a string decoder.

8. The memory device of claim 1, the control circuitry configured to deselect a particular string in the plurality of strings by applying a turn-off voltage to one or both of a first string select line in the first string select lines coupled to the particular string, and a second string select line in the second string select lines coupled to the particular string.

9. The memory device of claim 1, wherein the second turn-on voltage is lower than the first turn-on voltage.

10. The memory device of claim 1, wherein the plurality of stacks includes even stacks and odd stacks, comprising:

data storage structures on sidewalls of corresponding even stacks and odd stacks of conductive strips in the plurality of stacks; and semiconductor films disposed on the data storage structures on the sidewalls of the corresponding even stacks and odd stacks, and connected to form a current path from an upper end to a lower end of the semiconductor films on the corresponding even stacks, and from a lower end to an upper end of the semiconductor films on the corresponding odd stacks.

11. The memory device of claim 10, wherein the even stacks of conductive strips include the first upper strips configured as the first string select lines and the second upper strips configured as the second string select lines.

12. The memory device of claim 10, wherein the odd stacks of conductive strips include upper strips configured as ground select lines.

13. The memory device of claim 10, wherein at least one of the even stacks and odd stacks of conductive strips include bottom strips configured as assist gates disposed below the intermediate strips.

14. The memory device of claim 1, comprising:

data storage structures on sidewalls of stacks of conductive strips in the plurality of stacks; and semiconductor films disposed on the data storage structures on the sidewalls of the stacks, forming a current path from an upper end to a lower end of the semiconductor films between the stacks.

15. The memory device of claim 1, the stacks including bottom strips configured as ground select lines disposed below the intermediate strips.

16. A method of operating a memory device including a plurality of strings of memory cells, wherein a plurality of stacks of conductive strips includes first upper strips configured as first string select lines for the strings in the plurality of strings, second upper strips configured as second string select lines for the strings in the plurality of strings, and intermediate strips configured as word lines for the strings in the plurality of strings, the strings of memory cells being disposed vertically between stacks of conductive strips in the plurality of stacks, comprising:

selecting a particular string in the plurality of strings by applying a first turn-on voltage to a first string select line in the first string select lines coupled to the particular string, and a second turn-on voltage to a second string select line in the second string select lines coupled to the particular string.

17. The method of claim 16, wherein the second turn-on voltage is lower than the first turn-on voltage.

18. The method of claim 16, comprising:

deselecting a particular string in the plurality of strings by applying a turn-off voltage to one or both of a first string select line in the first string select lines coupled to the particular string, and a second string select line in the second string select lines coupled to the particular string.

19. The method of claim 16, wherein a given string in the strings of memory cells has a first end and a second end, the first end being proximate to conductive strips configured as first and second string select lines, and the second end being proximate a strip configured as a ground select line.

20. The memory device of claim 1, wherein a given string in the strings of memory cells has a first end and a second end, the first end being proximate to the conductive strips configured as first and second string select lines for the given string, and the second end being proximate a strip configured as a ground select line for the given string.

* * * * *